United States Patent [19]

Nakajima

[11] Patent Number: 5,349,555

[45] Date of Patent: Sep. 20, 1994

[54] REDUNDANCY CIRCUIT

[75] Inventor: Michio Nakajima, Hyogo, Japan

[73] Assignee: Mitsubishi Denki Kabushiki Kaisha, Tokyo, Japan

[21] Appl. No.: 52,629

[22] Filed: Apr. 27, 1993

[30] Foreign Application Priority Data

May 7, 1992 [JP] Japan .................................. 4-114710

[51] Int. Cl.$^5$ .............................................. G11C 11/40
[52] U.S. Cl. ...................................... 365/200; 365/96; 365/230.03
[58] Field of Search ................ 365/200, 149, 185, 96, 365/189.01, 230.01, 230.03

[56] References Cited

U.S. PATENT DOCUMENTS 4,908,798  3/1990  Urai ............................... 365/230.03

FOREIGN PATENT DOCUMENTS 55-501194  12/1980  Japan .

Primary Examiner—Terrell W. Fears
Attorney, Agent, or Firm—Oblon, Spivak, McClelland, Maier & Neustadt

[57] ABSTRACT

In order to obtain a redundancy circuit which can freely arrange its fuse in a required position with disciplined accessibility after employment, a combination circuit (50) receives outputs (QA0 to QA7) obtained by decoding a column address (AXM) by a column line decoder (2), signals (QB0 to QB7) indicating a faulty line, signals (L0 to L7) generated from the signals (QB0 to QB7) and an inverted signal (ENB*), to generate signals (YS0 to YS8) for controlling selecting switches for specifying column lines. If a K-th column line is faulty, a column line selecting switch for selecting the K-th column line is forcibly turned off and an (N+1)-th column line is allocated with respect to specification of an N-th column line (N≧K). Thus, fuse positions of redundancy circuits can be standarlized between products so that the products can be easily mass-produced and supplied at a low cost even if the redundancy circuits are contained in small quantities of various ASICs.

17 Claims, 8 Drawing Sheets

REDUNDANCY CIRCUIT

BACKGROUND OF THE INVENTION

1. Field of the Invention

The present invention relates to a redundancy circuit.

2. Description of the Background Art

FIGS. 7 and 8 illustrate a conventional redundancy circuit. Referring to FIG. 7, a memory cell array 24 comprising a plurality of memory cells 24a is connected with a 0-th bit line 3, a first bit line 4, . . . , a seventh bit line 10, and a spare bit line 11. A 0-th bit line selecting switch 12, a first bit line selecting switch 13, . . . , a seventh bit line selecting switch 19 and a spare bit line selecting switch 20 are provided successively in correspondence to the bit lines respectively.

The bit line selecting switches 12 to 20 are connected with a common bit line 25, to be further connected with an input/output control circuit 26 through the same. The bit lines 3 to 11 are successively provided with fuses 36 to 44 respectively.

The memory cell array 24 further comprises a row decoder 21, a row address input terminal 22 and word lines 23. A row address AXM which is formed by M data groups is inputted in the row address input terminal 22.

Referring to FIG. 8, a set of column addresses (Ay2, Ay1, Ay0) are inputted in column address input terminals 1, to be supplied to a column decoder 2 and a faulty line address generation circuit 45.

Faulty line address storage circuits 27a, 27b and 27c comprise fuses 28, 34 and 35 respectively. Since these faulty line address storage circuits 27a to 27c are similar in structure to each other, FIG. 8 illustrates only the internal structure of the faulty line address storage circuit 27a for the purpose of simplification. For example, the faulty line address storage circuit 27a comprises an inverter 29, a P-channel MOS transistor 30, a high resistor 31, a capacitor 32, and power supply terminals 33.

The faulty line address generation circuit 45 is connected with the faulty line address storage circuits 27a, 27b and 27c and a spare bit line selecting decoder 70.

The operation is now described. When combination of the column addresses is (Ay2, Ay1, Ay0)=(0, 0, 0), only an output QA0 is brought into a high level in the column decoder 2, to turn on only the 0-th bit line selecting switch 12 for selecting the 0-th bit line 3. When the combination of the column addresses is (Ay2, Ay1, Ay0)=(0, 0, 1), only an output QA1 is brought into a high level in the column decoder 2, to turn on only the first bit line selecting switch 13 for selecting the first bit line 4. When the combination of the column addresses is (Ay2, Ay1, Ay0)=(2, 1, 0), only an output QA2 is brought into a high level in the column decoder 2, to turn on only the second bit line selecting switch 14 for selecting the second bit line 5.

Thereafter in a similar manner, only an output QAK is brought into a high level in the column decoder 2 when the combination of the column addresses is at a value K ($\leq 7$), to turn on only the K-th bit line selecting switch, thereby selecting the K-th bit line.

On the other hand, the row decoder 21 brings only one of the word lines 23, which corresponds to the row address AXM, into a high level. Among the memory cells 24a provided on the word line 23 which is thus brought into a high level, that provided on the bit line selected by the column decoder 2 is selected. Information of the memory cell 24a thus accessed through the row address AXM and the combination of the column addresses (Ay2, Ay1, Ay0) is written in or read out from the input/output control circuit 26 through the common bit line 25.

When the fuse 28 is not cut in the faulty line address storage circuit 27a, the output of the inverter 29 goes high, the P-channel MOS transistor 30 is turned off and an input of the inverter 29 stably goes low due to low impedance of the fuse 28. At this time, an output Fy0 of the faulty line address storage circuit 27a goes low.

When the fuse 28 is cut, on the other hand, the input potential of the inverter 29 is raised up by the high resistor 31, whereby the output of the inverter 29 goes low. The capacitor 32 reduces pullup impedance of the inverter 29 in a transient state such as a rise time of the power supply terminal 33, so that the output Fy0 of the faulty line address storage circuit 27a stably goes high.

When a faulty memory cell is provided on the 0-th bit line 3, the fuses 28, 34 and 35 are not cut in the faulty line address storage circuits 27a, 27b and 27c. Thus, outputs of the faulty line address storage circuits 27a, 27b and 27c are in combination of (Fy2, Fy1, Fy0)=(0, 0, 0).

These outputs Fy2, Fy1 and Fy0 are inputted in respective selector terminals S of selectors 45a, 45b and 45c forming the faulty line address generation circuit 45. The selectors 45a, 45b and 45c output signals supplied in input terminals A when values inputted in the selector terminals S are "1", while the same output inverted signals A* (hereinafter symbol * represents logic inversion) of those supplied in the input terminals A. In the aforementioned case, therefore, the faulty line address generation circuit 45 outputs Ay2*, Ay1* and Ay0*.

When a faulty memory cell is provided on the first bit line 4, the fuse 28 is cut so that (Fy2, Fy1, Fy0)=(0, 0, 1). At this time, the faulty line address generation circuit 45 outputs (Ay2*, Ay1*, Ay0).

This also applies to other faulty memory cells which are provided on other bit lines. When a faulty memory is provided on the second bit line 5, for example, the fuse 34 is cut so that (Fy2, Fy1, Fy0)=(0, 1, 0). At this time, the faulty line address generation circuit 45 outputs (Ay2*, Ay1, Ay0*).

The spare bit line selecting decoder 70 takes the logical product of the three outputs of the faulty line address generation circuit 45. Therefore, an output C of the spare bit line selecting decoder 70 becomes "1" only when the column addresses designate a bit line which is provided with a faulty memory cell.

When any one of the memory cells 24a provided on the fourth bit line 7 is faulty due to a process defect or the like, the fuse 40 is cut by a laser or the like. As to the faulty line address storage circuits 27a, 27b and 27c, the fuse 35 is cut so that the outputs are in combination of (Fy2, Fy1, Fy0)=(1, 0, 0) in correspondence to the fourth bit line 7.

When the column addresses are inputted in combination of (Ay2, Ay1, Ay0)=(1, 0, 0) corresponding to the faulty bit line, the output C of the spare bit line selecting decoder 70 takes a value "1", whereby the spare bit line selecting switch 20 is turned on to access a memory cell provided on the spare bit line 11.

On the other hand, information of the originally accessed memory cell which is provided on the fourth bit line 7 is completely cut off since the fourth bit line 7 is cut.

When a memory cell provided on any one of the 0-th to seventh bit lines is faulty, the bit line is replaced by the spare bit line 11, to remedy the fault of the memory cell array 24.

The conventional redundancy circuit has the aforementioned structure. When a storage circuit is contained in an ASIC (application specific IC) product, therefore, fuse coordinates must be inputted in a fuse cutter every product since fuse positions are varied with products depending on memory scales/structures, logical scales and memory arrangement coordinates.

While a storage circuit accesses memory cells in a disciplined manner with respect to supplied addresses, such access is irregularized after employment of a redundancy circuit and hence fault detectability of a fault detection pattern formed on the premise of discipline is disadvantageously reduced.

SUMMARY OF THE INVENTION

A redundancy circuit according to a first aspect of the present invention comprises (a) storage means having (M+N) storage columns including M specific redundant columns such that each storage column is substantially formed by a plurality of storage units, (b) faulty column specifying means for outputting a faulty column signal indicating J faulty columns being storage columns having faulty storage units, (c) column signal specifying means for outputting a column signal indicating specific one of the storage columns and a match signal indicating match/mismatch of the specific one of the storage columns and the faulty columns, (d) a combination circuit receiving the column signal, the faulty column signal and the match signal for specifying one of the specific redundant columns in correspondence to the specific one of the storage columns when the specific one of the storage columns is a faulty column, and (e) an enable circuit for generating an enable signal for controlling the operation of the combination circuit, where M and N represent positive integers and J ($\leq$M) represents a non-negative interger.

Preferably, the faulty column specifying means comprises (b-1) original faulty column signal generation means for outputting an original faulty column signal, and (b-2) faulty column signal conversion means for converting the original faulty column signal to a faulty column signal, while the column signal specifying means comprises (c-1) an input terminal for receiving an original column signal, (c-2) column signal conversion means for converting the original column signal to a column signal, and (c-3) match detection means for receiving the original column signal and the original faulty column signal for generating a match signal.

More preferably, the enable circuit includes a fuse which is arranged in the exterior of the pattern layout of the storage means, to define the enable signal in response to conduction/non-conduction of the fuse.

When the specified signle storage column is faulty in the redundancy circuit according to the first aspect of the present invention, the combination circuit specifies a specific redundant column in replacement.

According to the first aspect of the present invention, as hereinabove described, it is not necessary to provide any fuse in the vicinity of the storage means, and products can be easily mass-produced even if the inventive redundancy circuits are contained in small quantities of various types of ASICs, to enable supply of the products at a low cost. Further, speed loss is reduced since the redundancy circuit can be implemented in a simple circuit structure.

A redundancy circuit according to a second aspect of the present invention comprises (a) storage means having (M+N) storage columns including M redundant columns such that each storage column is substantially formed by a plurality of storage units, (b) faulty column specifying means for outputting a faulty column signal indicating J faulty columns being storage columns having faulty storage units, (c) column signal specifying means for outputting a column signal indicating a K-th storage column, (d) a combination circuit receiving the column signal and the faulty column signal for newly sequencing the first to (N+J)-th storage columns, excluding the J faulty columns, as the first to N-th columns in due order from the low numbered column and specifying the new K-th storage column, and (e) an enable circuit for generating an enable signal for controlling the operation of the combination circuit, where M, N and K ($\leq$M) represent positive intergers and J ($\leq$M) represents a non-negative integer.

Preferably both of the integers M and J are 1.

Further preferably, the enable circuit includes a fuse which is arranged in the exterior of the pattern layout of the storage means, to define the enable signal in response to conduction/non-conduction of the fuse.

In the redundancy circuit according to the second aspect of the present invention, the combination circuit newly sequences the storage columns excluding the faulty column.

According to the second aspect of the present invention, faulty lines can be remedied without deteriorating address access discipline, to attain high quality.

Hence, a first object thereof is to obtain a redundancy circuit having a simple circuit structure, in which a fuse can be freely arranged with no necessity for provision on any bit line.

A second object of the present invention is to obtain a redundancy circuit which can access memory cells in a disciplined manner also after employment of a spare bit line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
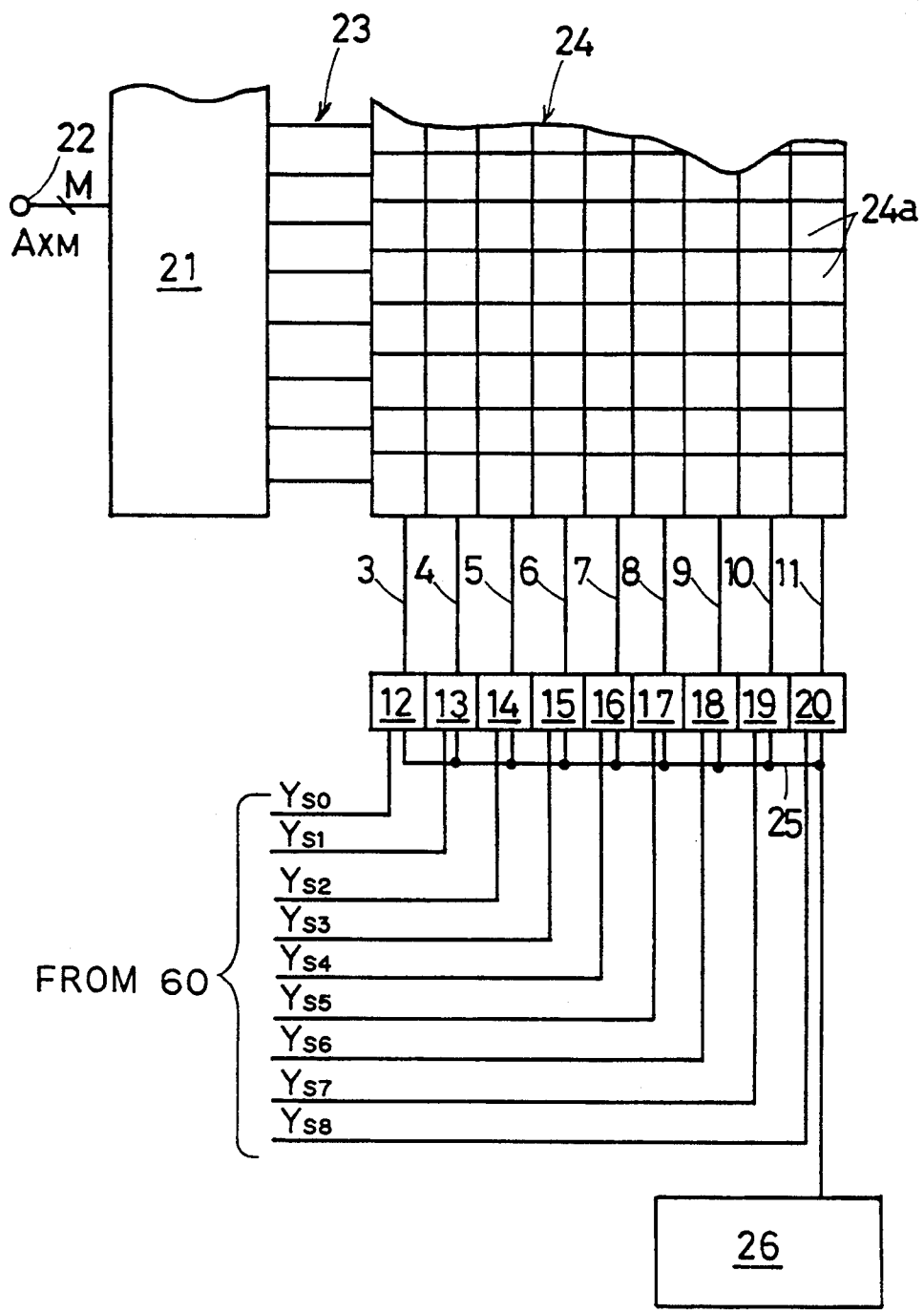
FIG. 1 is a circuit diagram of a redundancy circuit according to a first embodiment of the present invention.
Figure 2:
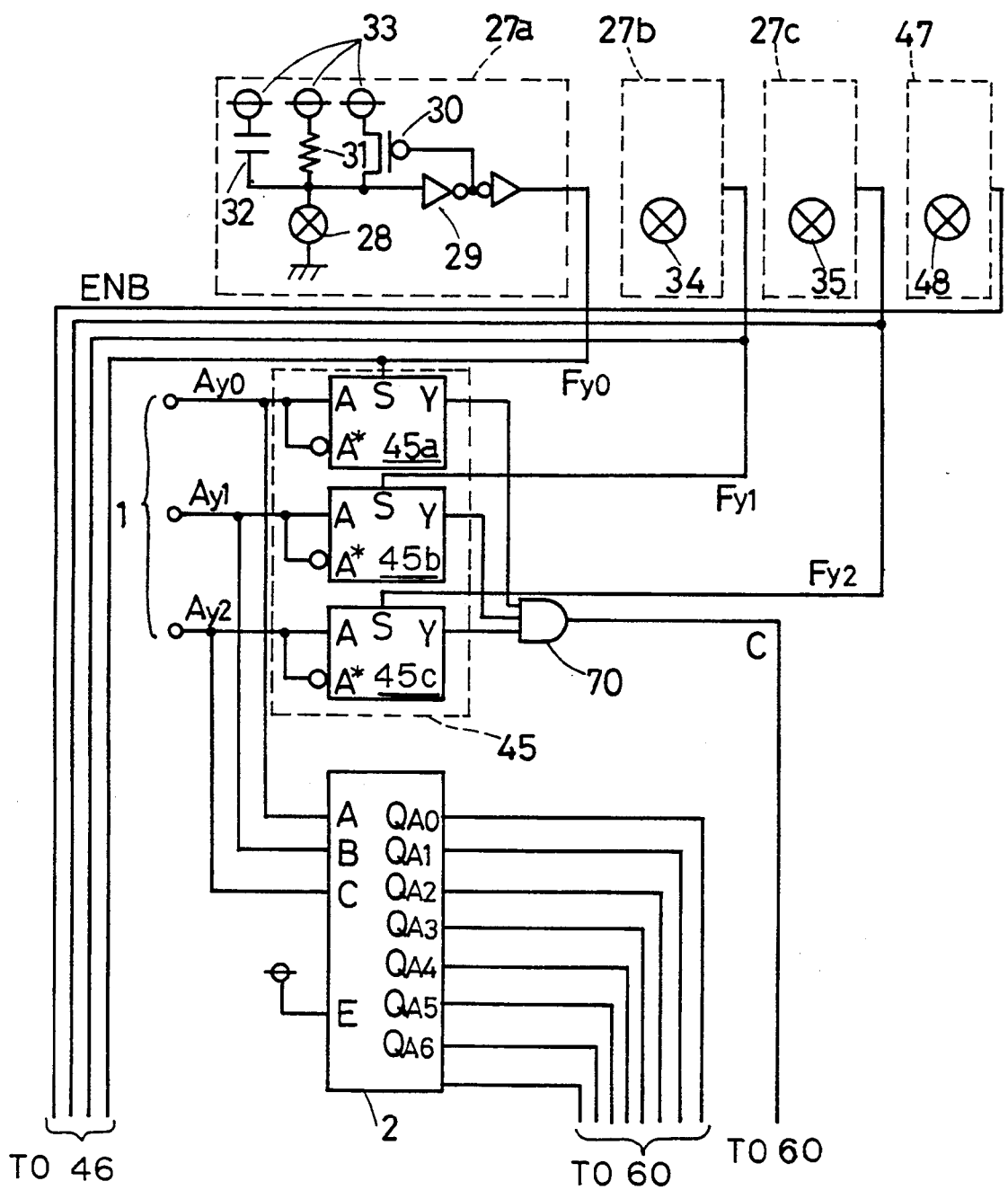
FIG. 2 is a circuit diagram of the redundancy circuit according to the first embodiment of the present invention.
Figure 3:
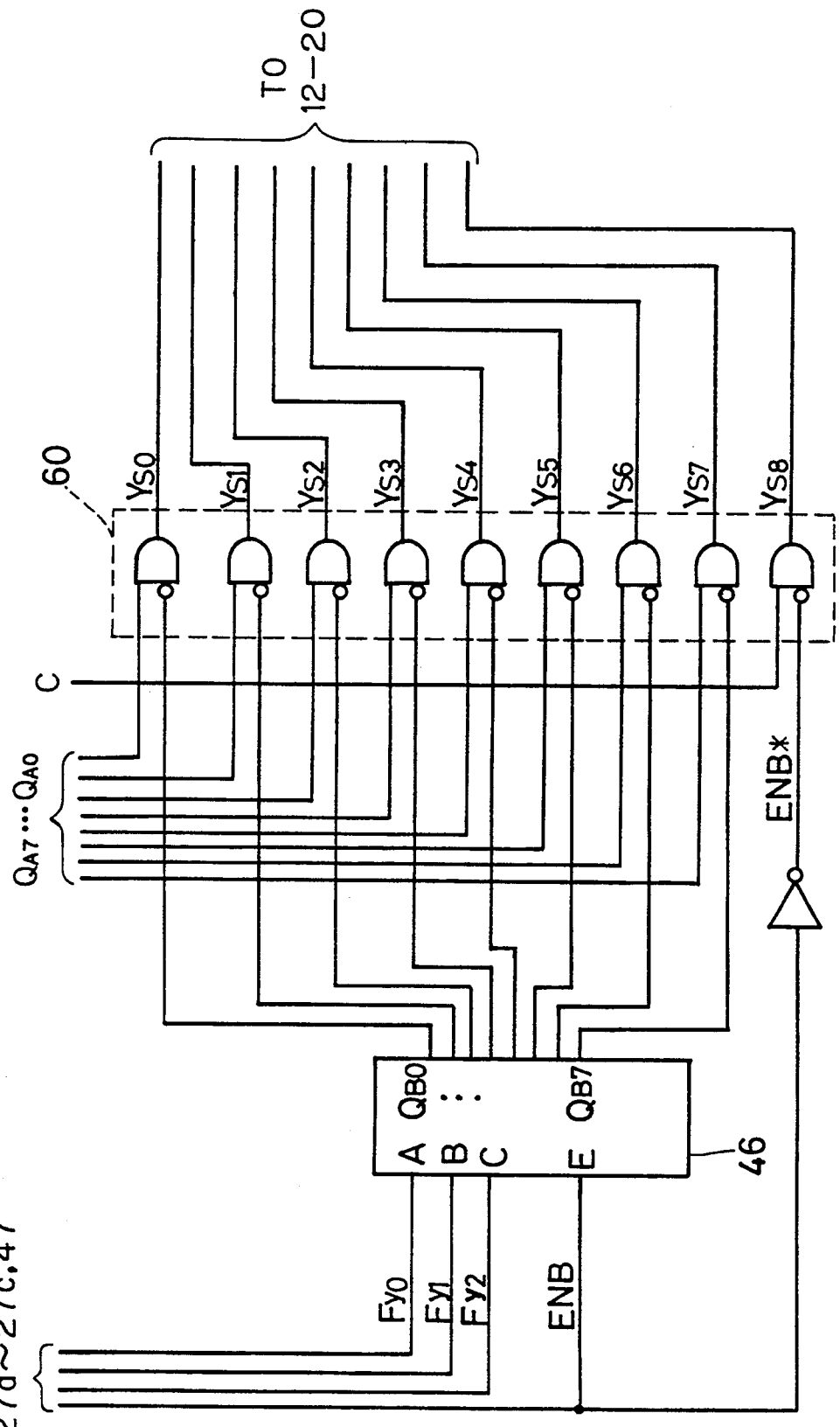
FIG. 3 is a circuit diagram of the redundancy circuit according to the first embodiment of the present invention.

FIGS. 1 to 3 are circuit diagrams showing a redundancy circuit according to a first embodiment corresponding to the first aspect of the present invention. Referring to FIG. 1, a memory cell array 24 comprising a plurality of memory cells 24a is connected with a 0-th bit line 3, a first bit line 4 . . . , a seventh bit line 10, and a spare bit line 11. A 0-th bit line selecting switch 12, a first bit line selecting switch 13, . . . , a seventh bit line selecting switch 19, and a spare bit line selecting switch 20 are provided successively in correspondence to these bit lines. The bit line selecting switches 12 to 20 are connected to a common bit line 25, to be further connected to an input/output contrtol circuit 26 through the same.

Figure 7:
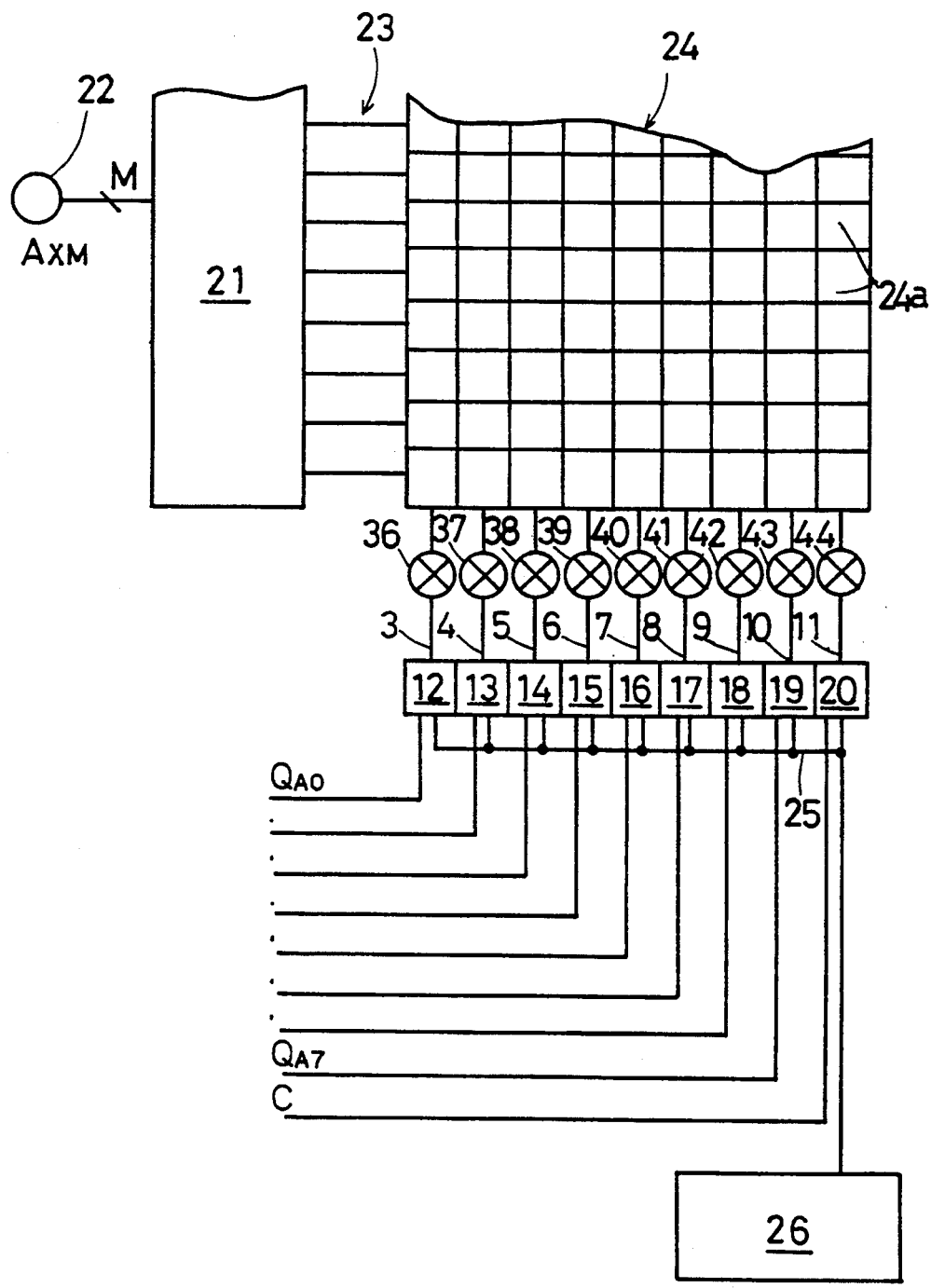
FIG. 7 is a circuit diagram of a conventional redundancy circuit.
Figure 8:
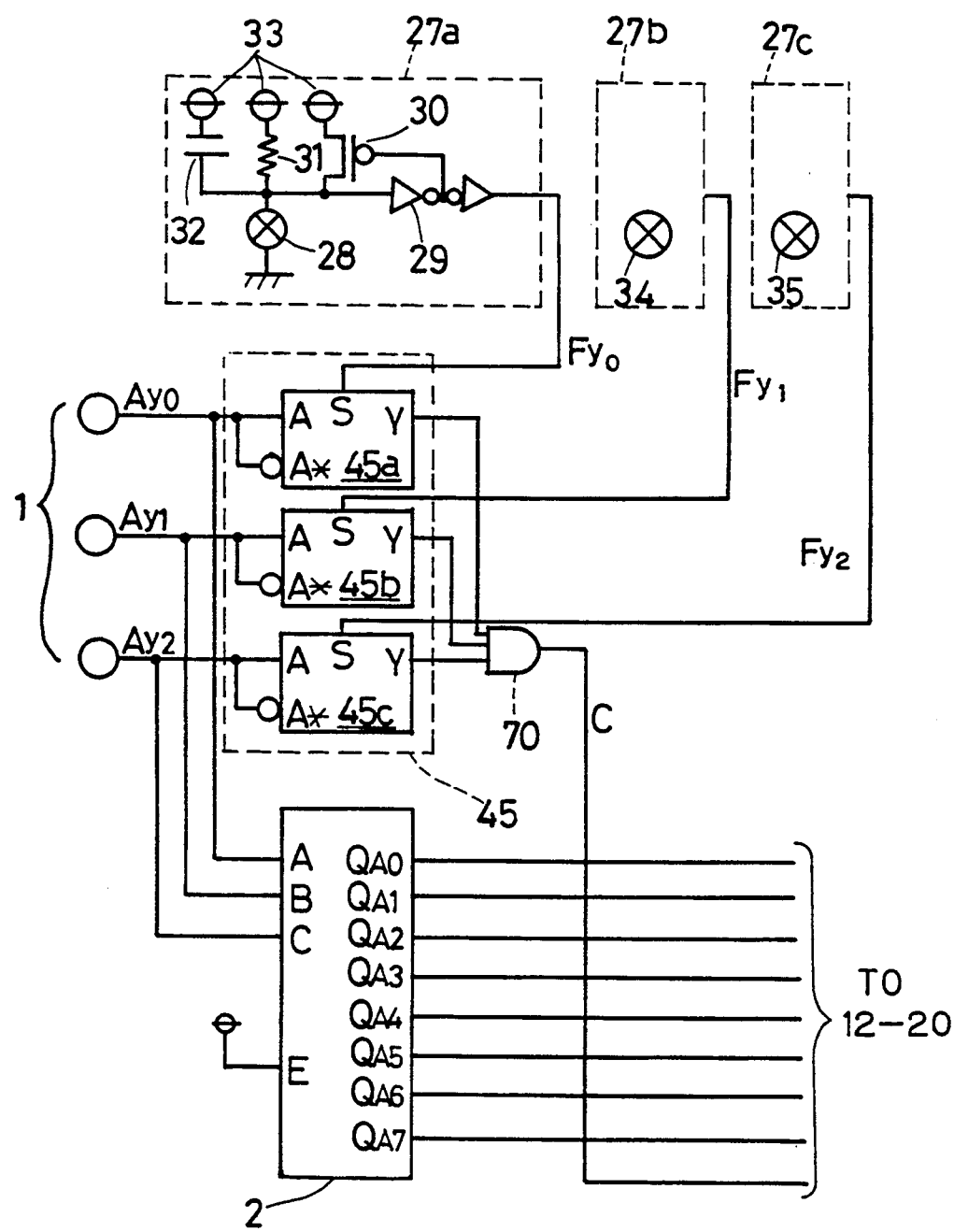
FIG. 8 is a circuit diagram of the conventional redundancy circuit.

As hereinabove described, a structure similar to that of the conventional redundancy circuit shown in FIG. 7 is provided around the memory cell array 24, while it is not necessary to provide fuses 36 to 44 in the respective ones of the bit lines 3 to 11.

The memory cell array 24 further comprises a row decoder 21, a row address input terminal 22, and word lines 23. Similarly to the conventional case, the row address input terminal 22 receives a row address AXM which is formed by M data groups.

Referring to FIG. 2, a column address input terminal 1 receives a set of column addresses (Ay2, Ay1, Ay0), which are supplied to a column decoder 2 and a faulty address generation circuit 45, similarly to the conventional case. Structures and connection modes of faulty line address storage circuits 27a, 27b and 27c, the faulty line address generation circuit 45 and a spare bit line selecting decoder 70 are also similar to those of the conventional case.

Dissimilarly to the conventional case, further provided is an enable circuit 47, which is similar in structure to the faulty line address storage circuit 27a. The enable circuit 47 is provided with a fuse 48 in correspondence to a fuse 28 provided in the faulty line address storage circuit 27a. While the faulty line address storage circuits 27a, 27b and 27c provide outputs Fy0, Fy1 and Fy2, the enable circuit 47 similarly outputs an enable signal ENB.

Referring to FIG. 3, the faulty bit line selecting decoder 46 receives the outputs FY2, FY1 and FY0 and the enable signal ENB. The faulty bit line selecting decoder 46 operates when the enable signal ENB is "1", to output signals QB0 to QB7 for specifying faulty lines in response to the value of the combination of the outputs Fy2, Fy1 and Fy0. When (Fy2, Fy1, Fy0)=(0, 0, 1), for example, the signal QB0 is "1" and the remaining outputs are "0". When (Fy2, Fy1, Fy0)=(0, 0, 1), the signal QB1 is "1" and the remaining outputs are "0", while the signal QB2 is "1" and the remaining outputs are "0" when (Fy2, Fy1, Fy0)=(0, 1, 0). Thereafter in a similar manner, the outputs Fy2, Fy1 and Fy0 are decoded to the signals QB0 to QB7.

The combination circuit 60 receives an output C of the spare bit line selecting decoder 70, outputs QA0 to QA7 of the column decoder 2, the outputs QB0 to QB7 of the faulty bit line selecting decoder 46 and a logically inverted signal ENB* of the enable signal ENB, to output selecting switch control signals YS0 to YS8. The selecting switch control signals YS0 to YS7 control ONs and OFFs of the bit line selecting switches 12 to 19 respectively, while the selecting switch control signal YS8 controls ON and OFF of the spare bit line selecting switch 20.

When there is no bit line (hereinafter referred to as "faulty bit line") having a faulty memory cell 24a, the fuse 48 of the enable circuit 47 is not cut and the enable signal ENB becomes "0". In this case, the combination of the selecting switch control signals is (YS0, YS1, YS2, YS3, YS4, YS5, YS6, YS7, YS8)=(QA0, QA1, QA2, QA3, QA4, QA5, QA6, QA7, 0). Since the selecting switch control signal YS8 is fixed at "0", the spare bit line selecting switch 20 remains in an OFF state. The bit lines shown by the column decoder 2 directly correspond to those of the memory cell array 24.

When the memory cell array 24 has a faulty bit line, on the other hand, the fuse 48 of the enable circuit 47 is cut and the enable signal ENB becomes "1". In this case, the faulty bit line selecting decoder 46 decodes the outputs (Fy2, Fy1, Fy0) of the faulty line address storage circuits 27a, 27b and 27c.

Each selecting switch control signal YSK (K=0 to 7) outputs the output QAK of the column decoder 2 when the output QBK of the faulty bit line selecting decoder 46 is "0", while the same is fixed at "0" when the output QBK is "1". Since the output QBK indicates whether or not the bit line is faulty, the output YSK of the combination circuit 60 fixes the faulty bit line selecting switch in an OFF state, to cut off the faulty bit line from the common bit line 25 by a logic circuit.

When the received column addresses Ay2, Ay1 and Ay0 correspond to the outputs Fy2, Fy1 and Fy0 of the faulty line address storage circuits 27a, 27b and 27c, all of selectors 45a, 45b and 45c provided in the faulty line address generation circuit 45 output "1" and the output C of the spare bit line selecting decoder 70 becomes "1". Since the signal ENB* becomes "0", the selecting switch control signal YS8 is fixed at "1" to turn on the spare bit line selecting switch 20.

Therefore, when the fourth bit line 7 is faulty, for example, the combination of the selecting switch control signals is (YS0, YS1, YS2, YS3, YS4, YS5, YS6, YS7, YS8 )=(QA0, QA1, QA2, QA3, 0, QA5, QA6, QA7, QA4).

Since the selecting switch control signal YS4 is fixed at "0", the bit line selecting switch 16 corresponding to the faulty bit line is turned off, and the bit line selecting switch 20 corresponding to the spare bit line is turned on when the column addresses indicating the fourth bit line 7 are received.

Thus, when there is a faulty bit line and column addresses corresponding thereto are received, the faulty bit line is turned off by the logic circuit and the spare bit line is turned on in replacement, whereby it is not necessary to provide any fuse in the pattern layout of the memory cell array 24.

Second Embodiment

Figure 4:
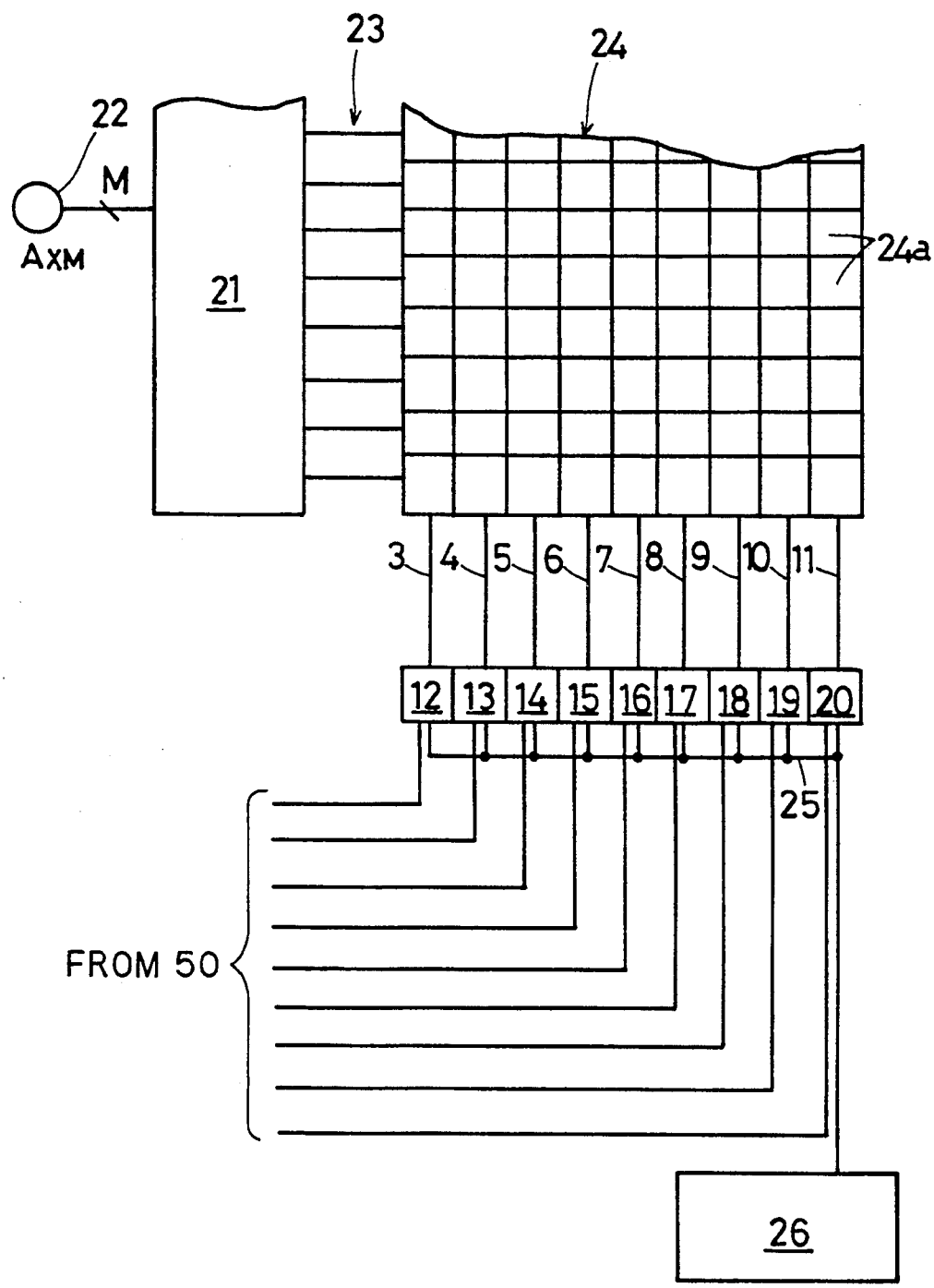
FIG. 4 is a circuit diagram of a redundancy circuit according to a second embodiment of the present invention.
Figure 5:
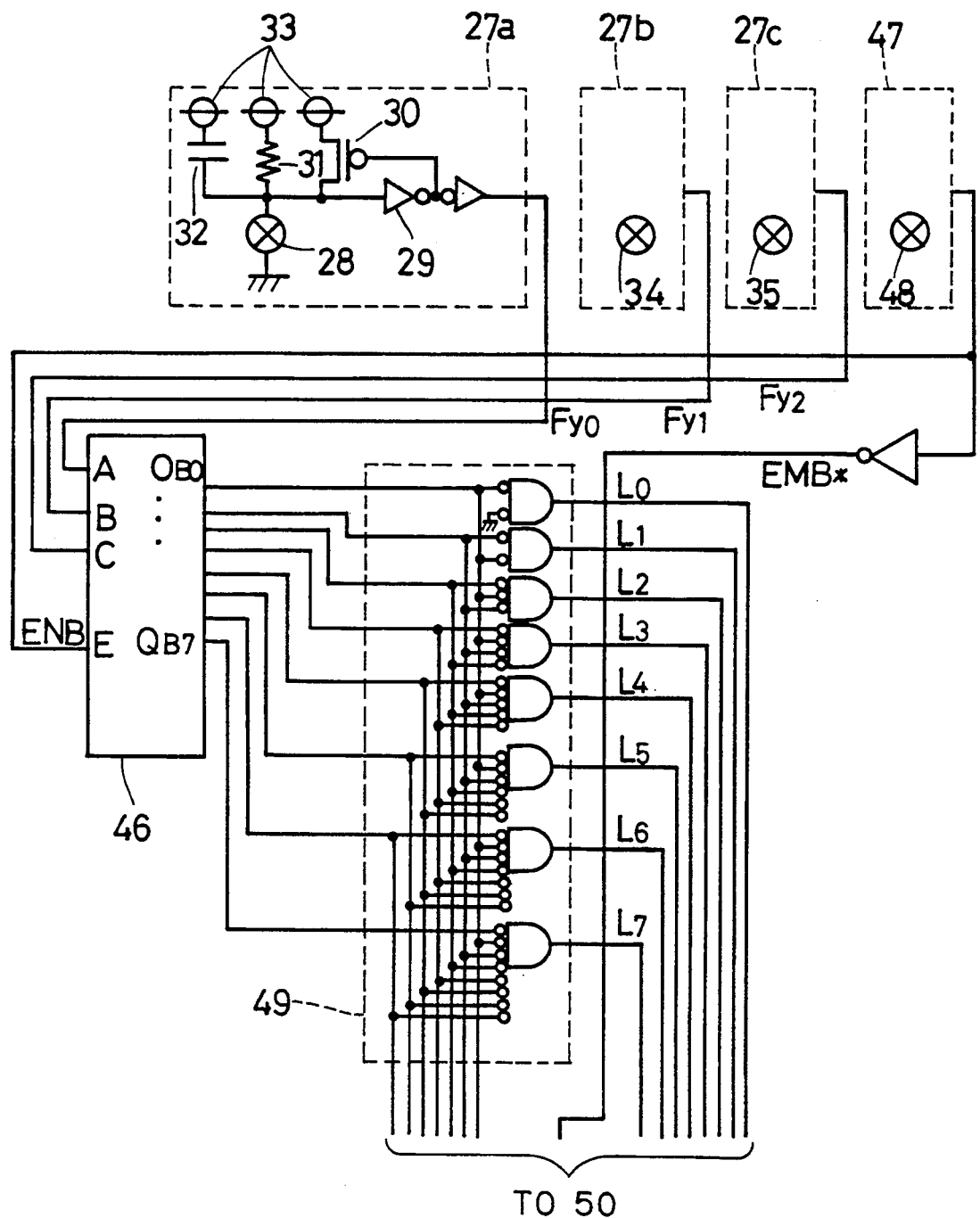
FIG. 5 is a circuit diagram of the redundancy circuit according to the second embodiment of the present invention.
Figure 6:
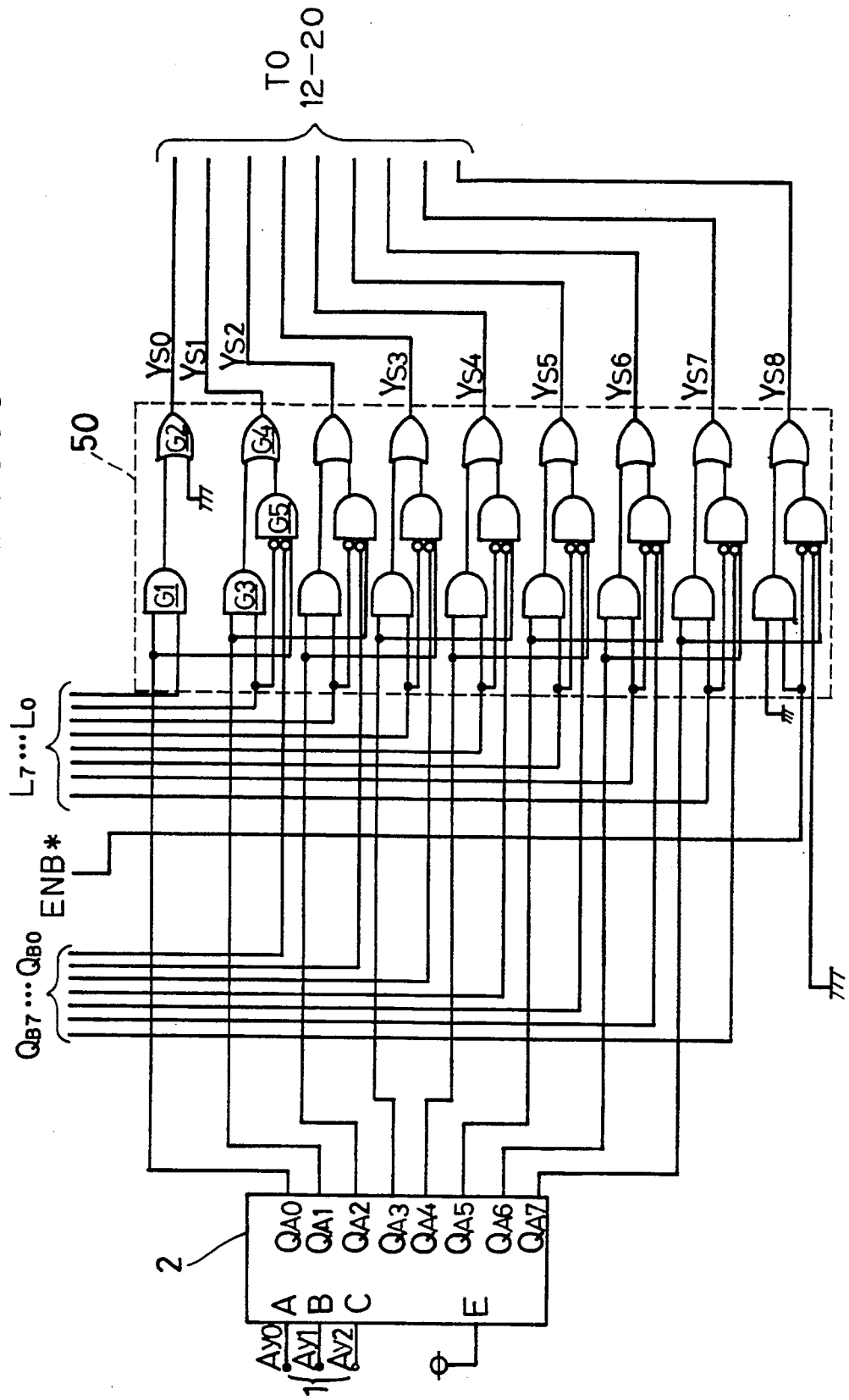
FIG. 6 is a circuit diagram of the redundancy circuit according to the second embodiment of the present invention.

FIGS. 4 to 6 are circuit diagrams showing a redundancy circuit according to a second embodiment corresponding to the second aspect of the present invention. FIG. 4 illustrates a structure which is similar to that shown in FIG. 1. Also in this embodiment, a memory cell array 24 comprises a row decoder 21, a row address input terminal 22 and word lines 23. The memory cell array 24 is also coonnected with 0-th to 7-th bit lines 3 to 10 and a spare bit line 11 as an 8-th bit line. These bit lines 3 to 11 are respectively provided with bit line selecting switches 12 to 20, which are further connected to an input/output circuit 26 through a common bit line 25.

Referring to FIG. 5, the redundancy circuit is also provided with faulty line address storage circuits 27a, 27b and 27c and an enable circuit 47, similarly to the first embodiment. When an enable signal ENB is "0", i.e., when a fuse 48 of the enable circuit 47 is not cut, a faulty bit line selecting decoder 46 is disabled and all outputs QB0 to QB7 become "0". When the enable signal ENB is "1" i.e., when the fuse 48 of the enable circuit 47 is cut, on the other hand, the faulty bit line selecting decoder 46 is enabled and the outputs QB0 to QB7 are obtained by decoding outputs Fy0, Fy1 and Fy2 of the faulty line address storage circuits 27a, 27b and 27c. The contents of this decoding are similar to those of the first embodiment.

A combination circuit 49 outputs (L0, L1, L2, L3, L4, L5, L5, L7)=(0, 0, 0, 0, 0, 0, 0, 0) when the output QB0 is "1", while outputting (L0, L1, L2 L3, L4, L5, L6, L7)=(1, 0, 0, 0, 0, 0, 0, 0) when the output QB1 is "1". Thereafter in a similar manner, values of the outputs L0 to L(K−1) become "1" while those of the outputs LK to L7 become "0" when the output QBK is "1".

Referring to FIG. 6, another combination circuit 50 receives the outputs L0 to L7 of the combination circuit 49, outputs QA0 to QA7 obtained by decoding a column address AXM, the outputs QB0 to QB7 of the faulty bit line selecting decoder 46 indicating a faulty bit line, and an inverted signal ENB*, to output selecting switch control signals YS0 to YS8.

When the outputs L0 to L7 are in combination of (L0, L1, L2, L3, L4, LS, L6, L7)=(0, 0, 0, 0, 0, 0, 0, 0), the selecting switch control signal YS0 becomes "0" by gates G1 and G2. Further, the selecting switch control signal YS1 becomes equal to the output QA0 of a column decoder 2 by the gates G3, G4 and G5. Thererafter in a similar manner, the selecting switch control signals YS0 to YS8 become (YS0, YS1, YS2, YS3, YS4, YS5, YS6, YS7, YS8 )=("0", QA0, QA1, QA2, QA3, QA4, QA5, QA6, QA7), and the first to eighth bit lines 4 to 11 excluding the 0-th bit line 1 are selected by the column address AXM.

When the combination circuit 49 outputs (L0, L1, L2, L3, L4, L5, L6, L7 )=(1, 0, 0, 0, 0, 0, 0, 0), the other combination circuit 50 outputs (YS0, YS1, YS2, YS3, YS4, YS5, YS6 YS7, YS8 )=(QA0, "0", QA1, QA2, QA3, QA4, QA5, QA6, QA7).

Similarly, when vaues of the outputs L0 to L(K−1) of the combination circuit 49 are "1" and those of the outputs LK to L7 are "0", i.e., when the output QBK of the faulty bit line selecting decoder 46 is "1", the values of the outputs YS0 to YS(K−1) of the combination circuit 50 are equal to the outputs QA0 to QA(K−1) of the column decoder 2 respectively, while the values of the outputs YS(K+1) to YS8 are equal to those of the outputs QAK to QA7 respectively. The output YSK becomes "0".

Similarly to the first embodiment, only the control signal for the selecting switch corresponding to the faulty bit line is brought into "0" by a logic circuit and the selecting switch is fixed in an OFF state, whereby it is not necessary to provide any fuse in the pattern layout of the memory cell array 24.

Dissimilarly to the first embodiment, however, the faulty bit line is not necessarily regularly replaced by the spare bit line 11. When there is such a faulty bit line, a bit line indicated by the column address AXM is specified with respect to the bit lines excluding the faulty bit line. Thus, it is possible to use the spare bit line 11 without damaging discipline of the column address AXM.

While the invention has been shown and described in detail, the foregoing description is in all aspects illustrative and not restrictive. It is therefore understood that numerous modifications and variations can be devised without departing from the scope of the invention.

I claim:

1. A redundancy circuit comprising:
   (a) storage means having (M+N) storage columns including M specific redundant columns, each said storage column being substantially formed by a plurality of storage units;
   (b) faulty column specifying means for outputting a faulty column signal indicating J faulty columns being storage columns having faulty said storage units;
   (c) column signal specifying means for outputting a column signal indicating specific one of said storage columns and a match signal indicating match/mismatch of said specific one of storage columns and said faulty columns;
   (d) a combination circuit receiving said column signal, said faulty column signal and said match signal for specifying one of .said specific redundant columns in correspondence to said specific one of storage columns when said specific one of storage columns is a faulty column; and
   (e) an enable circuit for generating an enable signal for controlling the operation of said combination circuit, where M and N represent positive integers and J (≦M) represents a non-negative integer.

2. A redundancy circuit in accordance with claim 1, wherein
   said storage means has equal numbers of said storage units in respective said storage columns, and is arranged in the form of a matrix.

3. A redundancy circuit in accordance with claim 1, wherein
   said faulty column specifying means comprises:
   (b-1) original faulty column signal generation means for outputting an original faulty column signal, and
   (b-2) faulty column signal conversion means for converting said original faulty column signal to said faulty column signal, and
   said column signal specifying means comprises:
   (c-1) an input terminal for receiving an original column signal,
   (c-2) column signal conversion means for converting said original column signal to said column signal, and
   (c-3) match detection means for receiving said original column signal and said original faulty column signal and generating said match signal.

4. A redundancy circuit in accordance with claim 3, wherein
   both of said integers M and J are 1.

5. A redundancy circuit in accordance with claim 4, wherein
   said original faulty column generation means is substantially formed by a plurality of fuse circuits having fuses respectively for defining said original faulty column signal by conduction/non-conduction of said fuses.

6. A redundancy circuit in accordance with claim 5, wherein
said combination circuit has a logical element for taking the logical sum of said match signal and said enable signal,
the output of said logical element specifying said redundant columns.

7. A redundancy circuit in accordance with claim 3, further comprising activation means for activating said storage columns of said storage means being specified by said combination circuit.

8. A redundancy circuit in accordance with claim 3, wherein
said enable circuit includes a fuse being arranged in the exterior of the pattern layout of said storage means for defining said enable signal by conduction/non-conduction of said fuse.

9. A redundancy circuit comprising:
(a) storage means having (M+N) storage columns including M redundant columns, each said storage column being substantially formed by a plurality of storage units;
(b) faulty column specifying means for outputting a faulty column signal indicating J faulty columns being storage columns having faulty said storage units;
(c) column signal specifying means for outputting a column signal indicating a K-th said storage column;
(d) a combination circuit receiving said column signal and said faulty column signal for newly sequencing first to (N+J)-th said storage columns excluding said J faulty columns as first to N-th columns in order from the low numbered one and specifying the new K-th storage column; and
(e) an enable circuit for generating an enable signal for controlling the operation of said combination circuit,
where M, N and K ($\leq$M) represent positive integers and J ($\leq$M) represents a non-negative integer.

10. A redundancy circuit in accordance with claim 9, wherein
said storage means has equal numbers of said storage units in respective said storage columns, and is arranged in the form of a matrix.

11. A redundancy circuit in accordance with claim 9, wherein
said faulty column specifying means comprises:
(b-1) original faulty column signal generation means for outputting an original faulty column signal, and
(b-2) faulty column signal conversion means for converting said original faulty column signal to said faulty column signal.

12. A redundancy circuit in accordance with claim 11, wherein
said original faulty column signal generation means is substantially formed by a plurality of fuse circuits having fuses respectively for defining said original faulty column signal by conduction/non-conduction of respective said fuses.

13. A redundancy circuit in accordance with claim 11, wherein
said column signal specifying means comprises:
(c-1) an input terminal for receiving an original column signal, and
(c-2) column signal conversion means for converting said original column signal to said column signal.

14. A redundancy circuit in accordance with claim 9, wherein
both of said integers M and J are 1.

15. A redundancy circuit in accordance with claim 14, wherein
said combination circuit comprises:
(d-1) specifying means for outputting first to (N+1)-th specifying signals corresponding to said first to (N+1)-th storage columns respectively and taking binary logics, said specifying signals being lower-numbered as compared with those corresponding to said faulty columns are inverted in logical value as compared with remaining said specifying signals.

16. A redundancy circuit in accordance with claim 14, further comprising activation means for activating said storage columns of said storage means being specifyed by said combination circuit.

17. A redundancy circuit in accordance with claim 14, wherein
said enable circuit includes a fuse being arranged in the exterior of the pattern layout of said storage means for defining said enable signal by conduction/non-conduction of said fuse.

* * * * *